United States Patent [19]

Yanick

[11] 4,099,035

[45] Jul. 4, 1978

[54] HEARING AID WITH RECRUITMENT COMPENSATION

[76] Inventor: Paul Yanick, 673 Wood Ave., Edison, N.J. 08817

[21] Appl. No.: 707,049

[22] Filed: Jul. 20, 1976

[51] Int. Cl.$^2$ .......................................... H04R 29/00
[52] U.S. Cl. ............................ 179/107 FD; 179/1 N; 179/1 P
[58] Field of Search ............ 179/107 R, 107 FD, 1 P, 179/1 D, 1 SA, 1 N

[56] References Cited

U.S. PATENT DOCUMENTS

| | | | |
|---|---|---|---|
| 2,784,263 | 3/1957 | Curry et al. | 179/107 FD |
| 3,015,704 | 1/1962 | Behymer | 179/107 R |
| 3,551,588 | 12/1970 | Roworth | 179/1 SA |
| 3,627,912 | 12/1971 | Hearn | 179/1 SP |
| 3,678,416 | 7/1972 | Burwen | 179/1 P |
| 3,784,749 | 1/1974 | Shigeyama et al. | 179/1 P |
| 3,784,750 | 1/1974 | Stearns et al. | 179/1 N |
| 3,881,059 | 4/1975 | Stewart | 179/1 SP |
| 3,927,279 | 12/1975 | Nakamura et al. | 179/107 FD |
| 4,025,723 | 4/1977 | Blackledge | 179/1 VL |

OTHER PUBLICATIONS

E. Villchur, "Signal Processing to Improve Speech Intelligibility etc.", J. Ac. Soc. Am., vol. 53, No. 6, 1973.
S. Knorr, "A Hearing Aid for Subjects With High-Freq. Losses", IEEE Trans. on AC, S and SP, Dec. 1976.
P. Yanick et al., "Signal Processing to Improve Intelligibility in the Presence of Noise, etc.", IEEE Trans. AC, SP, and S.P., Dec. 1976.

*Primary Examiner*—Thomas W. Brown
*Assistant Examiner*—E. S. Kemeny
*Attorney, Agent, or Firm*—Arthur L. Plevy

[57] ABSTRACT

There is disclosed a speech processor for aiding persons with sensorineural hearing loss accompanied by recruitment. The apparatus processes speech into two channels by use of a low pass and a high pass filter. Each channel includes a compressor unit which serves to compress or expand speech according to predetermined frequency sensitive ratios. The outputs of the compressors are combined in a frequency equalizer network to provide a compensated signal which is directed to a hearing aid transducer to enable an improved response for a user. The disclosure also includes a two channel system which may be employed for designing and formulating specific characteristics for hearing aids for the handicapped.

27 Claims, 4 Drawing Figures

HEARING AID WITH RECRUITMENT COMPENSATION

BACKGROUND OF THE INVENTION

This invention relates to speech processing devices and more particularly to apparatus for processing signals in order to determine the characteristics of an optimum hearing aid for a handicapped person. The apparatus has utility both as a testing device for obtaining characteristics in the design of a hearing aid and as a hearing aid unit, as well.

This invention is the subject matter of a Disclosure Document entitled SPEECH PROCESSOR filed on Feb. 3, 1976 as Disclosure Document No. 046651 by Paul Yanick, Jr., the inventor herein.

A patient with a sensorineural hearing loss typically has a reduction in the comfortable range of loudness and an abnormal loudness growth designated as recruitment. The recruitment is frequency dependent and destroys normal relationships between the acoustical elements of speech and hence, reduces the informational capacity of the impaired ear. Such a patient with a sensorineural hearing loss has considerable difficulty understanding speech when it is amplified by a conventional hearing aid. The affected ear, when compared to the normal ear, tends to react with more sensitivity as loudness is increased over threshold strength.

As indicated above, the abnormal growth of loudness or recruitment is frequency dependent and hence, the frequencies affected destroy the significant structure of speech giving rise to distortion and hence, resulting in a loss of information.

Basically, there exists, in literature, graphs depicting the differences in response of a normal and abnormal ear to intensity levels near and above the threshold. Such graphs have been designated as EL graphs or equal loudness contours.

For examples of such results, reference is had to an article published in the Journal of the American Audiology Society, Vol. 1, No. 5 (1976) entitled EFFECTS OF SIGNAL PROCESSING ON INTELLIGIBILITY OF SPEECH IN NOISE FOR PERSONS WITH SENSORINEURAL HEARING LOSS by Paul Yanick, Jr., the inventor herein.

Implicit in the EL contours is a rapid growth of loudness which increases much faster at high frequencies.

There are many hearing aids existing in the prior art which employ various schemes to provide compensation. Such devices typically utilize automatic volume control, peak clipping and compression limiting. These devices have a linear input/output function until a predetermined threshold level is approached. Once this level is approached, the output level remains constant by reducing the gain of the entire signal. These hearing aids compensate to a certain extent for frequency loss by shaping the frequency response of the aid. They do not however, compensate for amplitude and the abnormal loudness growth.

Such devices amplify the energy present in the stronger vowels to levels which mask or obscure the lower energy consonants. Thus, a user of such a device will reduce the volume control and hence, lose the required gain for the lower energy consonants.

Speech sounds, as is known, have a great dynamic range in amplitude. Vowels are about 12 or 13 decibels (db) greater in intensity than the consonants, with the most powerful vowel occurring 28db above the weakest consonant. Hence, vowels have their greatest acoustic energy in the frequency band about 800Hz, while consonants are found above 1,500Hz.

Most subjects with a sensorineural hearing loss have normal hearing for the louder low frequency vowel sounds and subnormal hearing for the weaker high frequency consonant sounds. This, therefore indicates the problem that a user has with a conventional aid and hence, by reducing the volume control on such an aid, he sacrifices the consonant intelligibility for the sake of comfort.

Another conventional approach employed in the prior art is referred to as automatic, non-linear amplitude compression gain control. In these systems, the gain is decreased as the input levels increase. The input/output function is non-linear and is determined by the compression ratio of the particular aid. This method has been investigated and compared to automatic volume control hearing aids and has been described in a paper entitled IMPROVEMENT IN SPEECH DISCRIMINATION OF COMPRESSION VERSUS LINEAR AMPLIFICATION published in the Journal of Auditory Research (1973) in Vol. 13, pages 333–338 written by Paul Yanick, Jr. This technique does provide the hearing aid user with relief from discomfort and renders improved discrimination to the user in relatively low level noise areas. However, in the presence of background noise, the system does not provide the user with adequate relief. The appropriate data and information concerning such systems have been described in an article entitled DISCRIMINATION IN THE PRESENCE OF COMPETITION WITH AN AVC VERSUS A DRC HEARING AID published in the Journal of the American Audiology Society (1973) Vol. 1, No. 4, pages 12–17 by Paul Yanick, Jr.

A user having a sensorineural hearing loss is affected by a decrease in efficiency in adverse listening conditions due to an overmasking which is demonstrated by a shift in the signal to noise ratio and a change in the intelligibility function. Conventional hearing aids greatly increase the disruptive effect of background noise with the signal to noise ratio being 20 to 30db more adverse for the hearing aid user.

It has therefore been determined that in designing a hearing aid, one must consider both the loudness function and the user's ability to communicate in the presence of background noise. As indicated, a great disadvantage of automatic gain reduction in a hearing aid resides in the fact that as the gain is decreased by the stronger vowels and by low frequency background noise, an abnormal relationship between speech sounds occurs. This is due to the fact that the softer consonants are not properly amplified, resulting in a substantial loss in intelligibility. Apart from this fact is the fact that the gain reduction serves to equalize input levels and hence, the signal to noise ratio suffers. These factors effect the user's ability to understand speech by reducing the overall intelligibility.

In an attempt to overcome the deficiency of such a prior art system, a two channel automatic compression gain has been specified. With this technique, the vowels and low level ambient noise do not cause gain reduction, which is necessary for the softer consonants and thus attempt to maintain a normal relationship between speech sounds in such systems. The compression ratio can be set to match the recruitment present at each frequency to compensate for abnormal loudness function.

Such automatic compressor gain systems have been described in an article entitled SIGNAL PROCESSING TO IMPROVE SPEECH INTELLIGIBILITY IN PRECEPTIVE DEAFNESS published in the Journal of the Acoustical Society of America (1973) Vol. 53, No. 6 pages 1646–1657 by Edgar Villchur. This technique provides the hearing aid user with an increase in intelligibility. However, this system suffers in that when the user is in a non-communicative situation, low level ambient noise may become distracting and annoying. In addition, many patients with sensorineural hearing loss do not need any compensation for the abnormal loudness function in the low channel of compression. Persons with ski slope sensorineural hearing loss have normal or near normal loudness function, usually up to 1,500Hz.

It is therefore the object of this invention to provide a hearing aid which avoids the above noted problems by incorporating a compression threshold which is frequency sensitive and adjustable according to the loudness function of the impaired ear. In addition, a 1:1 linear function can be set in the low channel of compression if the loudness function is normal. Hence, a compression ratio of 2:1 may be used in the high channel, while a linear 1:1 mode can be used in the low channel. Post-frequency equalization can then shape the person's equal loudness contours to normal values. In addition, an expansion mode can be set below the compression threshold in the low channel to reduce the low level ambient noise.

BRIEF DESCRIPTION OF PREFERRED EMBODIMENT

There is disclosed an audio speech processor apparatus for aiding persons with sensorineural hearing loss, comprising of means responsive to a band of audio frequencies for splitting said band into a first low band of frequencies and a second high band of frequencies, a first compressor responsive to said low band of frequencies for compressing the same by a given predetermined factor, a second compressor responsive to said high band of frequencies for compressing the same by a different factor and means for combining said compressed first and second frequency bands to provide a composite signal manifesting a distribution of said band of audio frequencies compensated according to said hearing loss.

DETAILED DESCRIPTION OF FIGURES

Figure 1:
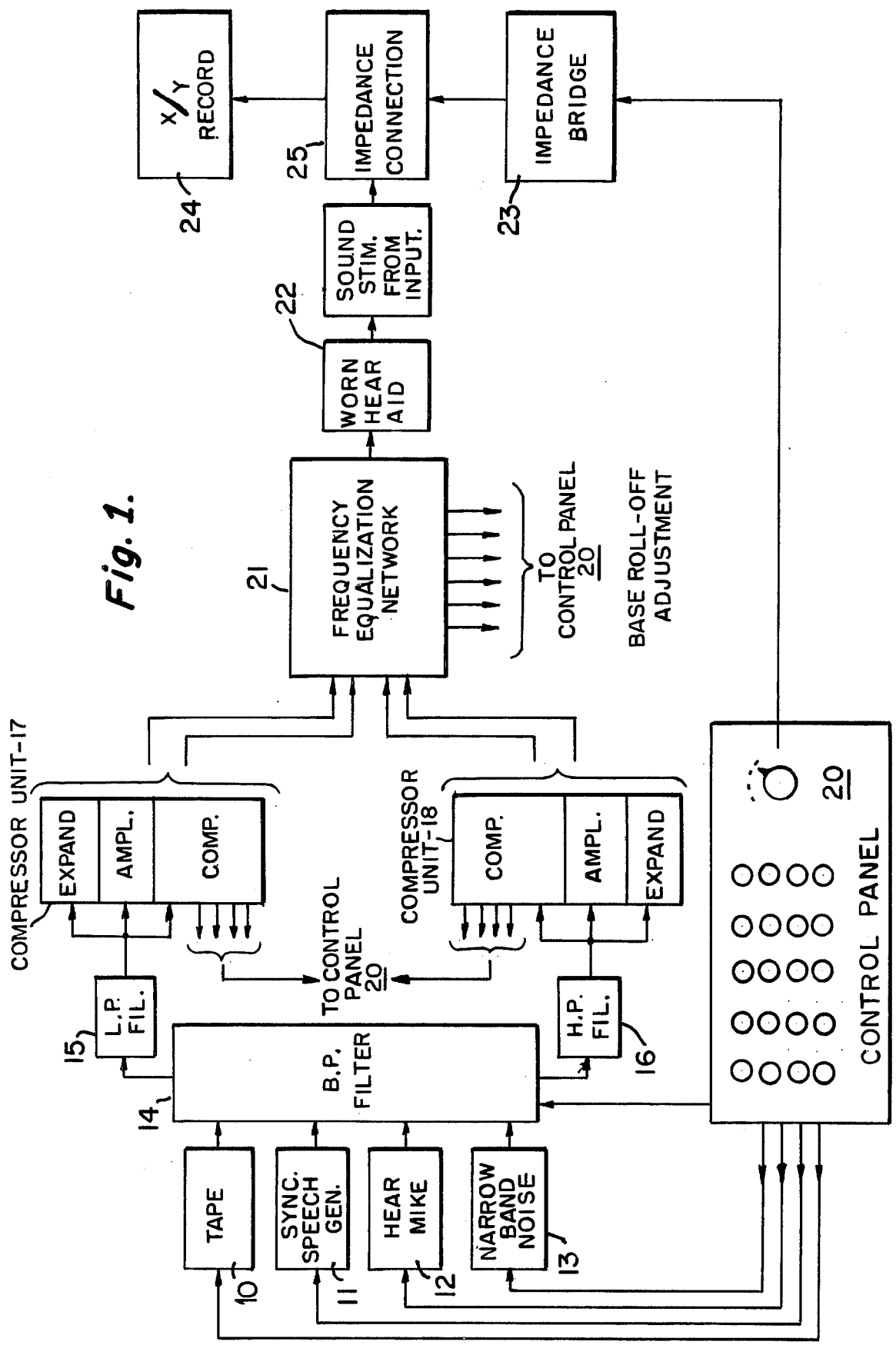
FIG. 1 is a block diagram of the speech processor according to this invention.

Referring to FIG. 1, a block diagram of a typical processor is shown in simple form. The unit includes four separate inputs which comprise a tape recorder 10, a synthetic speech generator 11, a microphone input 12, which may be associated with a wearable hearing aid which may be a directional or non-directional unit and a narrow band noise generator 13.

Each output of the input units 10 through 13 is applied to a band pass filter 14 which serves to split the speech band into two bands at an adjustable center frequency which may, for example, be originally set at 1,500Hz. In this manner, the output of the band pass filter 14 will consist of one band from 500 to 1,500Hz and another band from 1,500 to 4,000Hz. It is again noted that the center frequency or the frequency at which the bands are selected in this example of 1,500Hz, is adjustable.

One output from the band pass filter is applied to a low pass filter 15 which possesses a roll off of 48db per octave at 1,500Hz cycles. Another output from the band pass 14 is applied to a high pass filter 16 with a roll off of 48db per octave at 1,500Hz cycles.

The outputs of the low pass filter 15 and the high pass filter 16 are applied to two compressor units for each band shown by way of example, as 17 and 18 for the low band and high band respectively. Each compressor as 17 and 18 has an associated attack and release time for optimum operation.

The low band compressor 17 has an attack time of five milliseconds and a release time of 12 milliseconds. The high band compressor 18 has an attack time of 1 millisecond and a release time of 3 milliseconds. As is known, the attack time specifies the ability of the compressor to commence operation as compression within the period specified and the release time specifies the ability of the compressor to cease operation after the input signal terminates.

The compressors perform amplitude compression which can be implemented at any threshold value selected by an operator by means of a selector knob or switch located on a control panel 20. One of the compressors in each band is caused to operate to provide expansion of the signal which can be chosen or selected so that compression begins below the level chosen. This relates to the compression threshold of the unit.

Each compressor as 17 and 18 are operative to be responsive to a variable adjustment of the compression threshold, which is also selected from a suitable control on panel 20. The compressor ratios associated with the compressors have selectively adjustable ratios as for e.g. 1:2:1, 1:3:1, 1:4:1, and so on. Each ratio begins at a 1:1 and can be varied up to, for example, 4:1.

The compressors have a variable expansion ratio which can be selected according to the same or similar proportions, as indicated above for compression ratios. The output of the compressors as 17 and 18 are then applied to the input of a frequency equalization network or section 21. Section 21 is operative to provide selective bass roll offs at for example, 6,12,18,24 db per octave. These roll offs can further be adjusted and selected so that they start at any frequency selected in the two bands. For example, unit 21 can operate so that it provides a 12db per octave roll off starting at 1,500Hz and sloping downward toward 500Hz.

The unit 21 also contains an adjustable treble boost which can be varied by a suitable control also located on the control panel 20. The output of the equalizer network 21 is applied to the input of a conventional hearing aid receiver 22 which can be attached or fitted to a custom design ear mold worn by the subject.

In the controlateral ear, a probe tip can be inserted to measure the contraction of the stapedius reflex of the middle ear. This tip can be selected from any of the known standard type of impedance bridges 23 presently available and known as the Madsen, Grason Stadler, American Electromedics.

In addition, an X-Y plotter is coupled between the hearing aid 22 and the impedance connection 25, which device can provide an output depicting the actual frequency response of the hearing aid. The unit permits the practitioner to properly fit each and every handicapped person with the best hearing aid device possible. Accordingly, the unit will enable the practitioner to provide equal loudness contours by obtaining minimal audible pressures and maximal tolerable pressures provided through the wearable aid with the system placed in a neutral position in regard to the adjustable parameter. The system permits stapedius reflex thresholds to be obtained objectively by using the impedance bridge. The input section permits the application of various stimuli into the system and consequently, the hearing aid and probe tip to measure the patient's reflex threshold on the impedance bridge. Equal loudness measurements of the patient's ear can be examined by the practitioner and the results or outputs supplied to a computer which will operate to compare the measurements to a normal ear. The results can be analyzed in terms of loudness function, dynamic range of hearing and frequency response characteristics. The results obtained can be supplied to the networks of the processor as feedback signals to compensate for an abnormal loudness function, compressed dynamic range of hearing and loss of frequency sensitivity in certain regions of the subject's hearing, after calculation of desired characteristics. The proper input circuit is activated and equal loudness measurements are again made in order to check calculations previously implemented. Therefore, the complete set of equal loudness contours are restored to normal when reflex thresholds are again measured. These reflex thresholds which are obtained by impedance measurements determine the loudness function and frequency equalization reliability. The reflex thresholds are actually in equal loudness contour and this is a valuable operation mode of the system. For example, in children it is extremely difficult to obtain equal loudness measurements or threshold of hearing, due to the inability of the child to comprehend or adequately cooperate. By the use of this system, adequate data is automatically obtained and can be used by a practitioner to provide aural rehabilitation.

Basically, the system operates to enable the practitioner to compensate an impaired hearing function by attempting to measure and normalize equal loudness characteristics. The system can plot the final parameters which are permanently recorded to enable the practitioner to provide a custom design hearing aid, which compensates for the particular deficiency of each subject tested.

Thus, as depicted in FIG. 1, the compression threshold for the low and high bands can be separately specified. Since the low band compressor 17 is responsive to signals from 500 to 1,500Hz, the compression ratio for compressor 17 can be set to 45 decibels, while the ratio for compressor 18 can be set to 35 decibels. The expansion mode operates below the compression threshold in the low channel of compression where most of the ambient steady state noise is prevalent. Since frequency components of environmental noise are predominantly in the lower frequency range (below 1,500Hz) and most subjects with sensorineural hearing loss have better response in this region, the system provides relief from disruptive effects of background noise.

The tape input 10 may be a conventional tape recorder as a Pioneer RT-1050, ½-track recorder and is used to play tape recordings which may consist of the Harvard sentences as revised by the IEEE (1969). These sentences are recorded in a reverberant environment on one track, with background noise on another track. The response of the user to such sentences determines the settings necessary for proper hearing compensation.

The synthetic speech generator 11 enables the practitioner to determine the improvement of the handicapped in responding to certain vowels and consonants. The microphone 12 would be worn by a user and functions to pick up sound in the vicinity for processing. The narrow band noise generator 13 operates to permit one to introduce various background noise to further monitor the response of the user to typical noise levels.

The filters depicted in FIG. 1 can be implemented by the use of operational amplifiers. To obtain the required roll off, one may cascade a plurality of conventional operational amplifier circuits to formulate a low pass filter having a relatively flat frequency response to 1,500Hz with a roll off of 48db per octave. Hence, one may employ four coupled low pass filter sections as shown in FIG. 2, for example, to obtain the necessary roll off.

Figure 2:
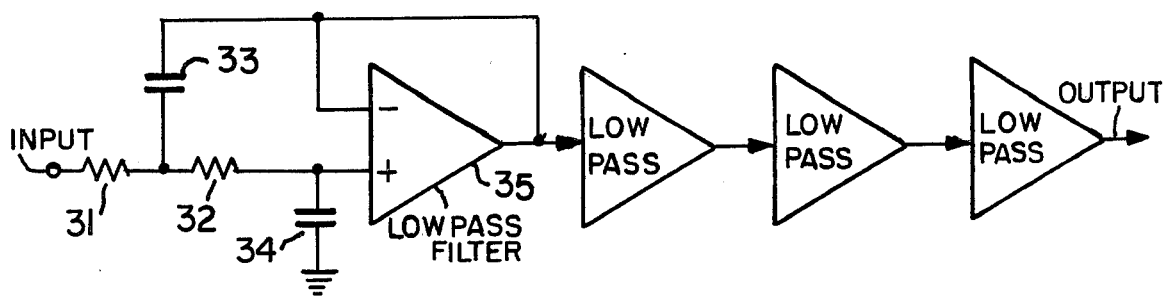
FIG. 2 is a schematic diagram of a low pass filter arrangement.

FIG. 2 shows a conventional operational amplifier employed as a low pass filter. The resistances 31 and 32 in conjunction with capacitors 33 and 34 determine the frequency response of the filter. The operational amplifier 35 is a conventional high gain integrated circuit which is available from many sources. Typical examples of such operational amplifier circuits may be had by referring to a text entitled APPLICATIONS OF LINEAR INTEGRATED CIRCUITS by Eugene R. Hnatec published by John Wiley & Sons (1975), Chapter 4.

Figure 3:
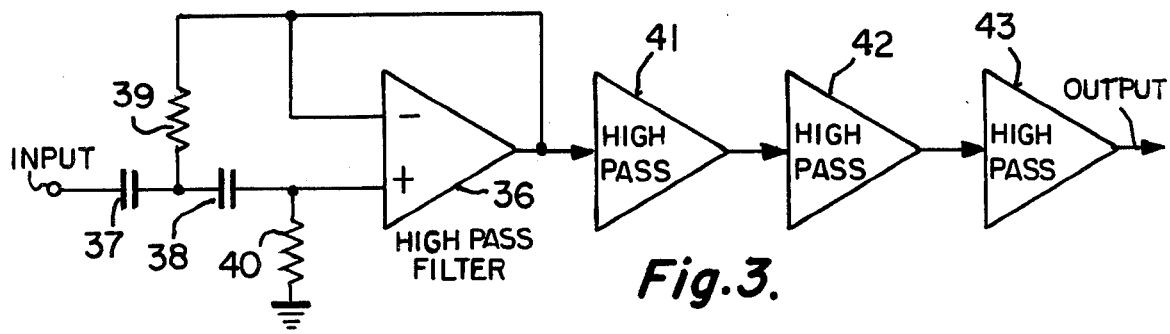
FIG. 3 is a schematic diagram of a high pass filter arrangement.

Similarly, a typical operational high pass filter is shown in FIG. 3, which also employs a high gain operational amplifier 36 and frequency determining resistors and capacitors as included in FIG. 2. To obtain the necessary response together with a 48db octave roll off, one would cascade three identical sections as 41, 42 and 43 of operational amplifier 36 to provide the required response.

Such techniques for constructing operational amplifiers using conventional circuitry are well known in the art and are shown, for example, in the above noted text.

Figure 4:
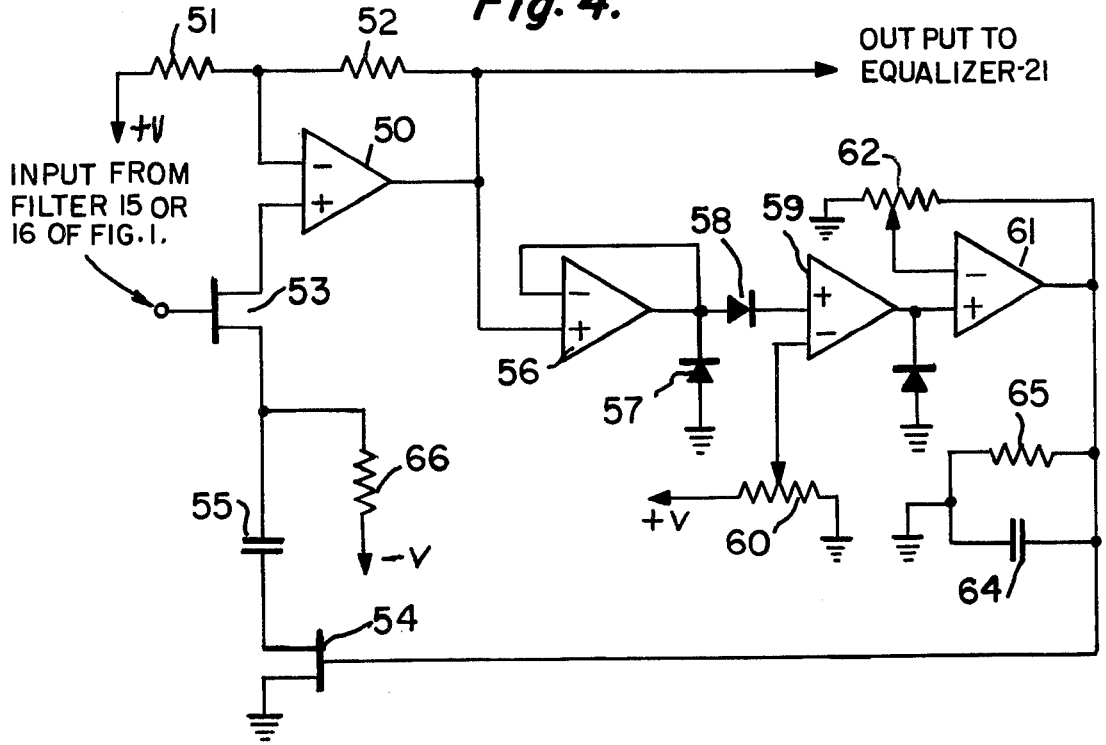
FIG. 4 is a schematic diagram of a compressor expander circuit used in this invention.

Referring to FIG. 4, there is shown a compressor expander circuit which can be used for compressor circuits 16 and 17 of FIG. 1. Basically, compression and expansion are well known in the audio field and are used, for example, to accommodate the volume range of a transmitter prior to transmission. For example, the original sound may have a volume range greater than the maximum volume range of the transmitter and must be compressed in some way.

In other instances, if the reproduced sound is to have the same volume range, one must use a volume expander which would serve to expand the range. As such, there are an extraordinary wide variety of devices for both compression and expansion.

In the circuit shown in FIG. 4, an operational amplifier 50 has its gain selected by a feed back arrangement consisting of resistors 51 and 52. The resistors 51 and 52 specify a quiescent gain. The input to the operational amplifier 50 is derived from a field effect transistor 53. The transistor 53 has its source electrode coupled to the non-inverting input of amplifier 50. The drain electrode of transistor 53 is coupled to the source electrode of a controlled FET 54 through a capacitor 55 shunted by a resistor 56. The drain electrode of transistor 54 is coupled to ground. The output of the amplifier 50 is applied directly to the equalizer circuit 21 and to the non-inverting input of a limiting operational amplifier 56.

The output of amplifier 56 is coupled to a diode clipping or limiting network consisting of diodes 57 and 58. The cathode of diode 58 is coupled to an input of another operational amplifier 59. The inverting input of amplifier 59 is coupled to a potentiometer 60.

The potentiometer 60 serves to set the threshold at which the amplifier 59 begins to conduct. The output of amplifier 59 is coupled to the non-inverting input of an operational amplifier circuit 61 having an adjustable feed back or gain control which is determined by potentiometer 62 directed between the input and output of amplifier 61.

The output of amplifier 61 is coupled to a parallel RC network consisting of capacitor 64 is shunt with resistor 65 and is fed back to the gate electrode of transistor 54.

Briefly, the circuit operates as follows:

The potentiometer 62 controls the gain of amplifier 61 and hence, depending upon the setting can cause the amplifier 50 to operate in a compression or an expansion mode. The potentiometer 60 serves to set the threshold at which the compression will take place. Hence, upon conduction of amplifier 59, amplifier 61 will conduct; the amount of conduction will be a function of the setting of potentiometer 62. The conduction of the amplifier 61 changes the impedance of transistor 54 and hence, the gain of transistor 53 to either present a larger or smaller signal to amplifier 50 depending upon whether a compression or expansion mode is implemented. The values of resistor 65 and capacitor 64 determine the release time for the compressor expander circuit and as indicated above. The release time on the low band is set to 12 milliseconds with a release time of 3 milliseconds on the high band. The attack time of the circuit is determined by the setting of the threshold potentiometer 60 in conjunction with the biasing of diodes 57 and 58 and affords a 5 millisecond attack time on the low band and a 1 millisecond attack time on the high band.

Since the compression threshold is frequency dependent, the potentiometer 60 can be adjusted according to the main frequency components of the sound received to provide the user with a reliable and optimum response.

The frequency equalization network 21 functions to combine or mix the processed high and low frequencies received from the compressors 17 and 18 to again recombine the audio signals into a single signal encompassing the band of 500 to 4,000 cycles. The output of the equalizer network goes directly to the hearing aid which is worn by a user.

Essentially, a hearing aid according to this invention would include an input pickup device as 12, the filters 14, 15 and 16, the compressors 17 and 18, the equalizer network 21 and the output transducer 22.

The same arrangement is employed in FIG. 1 in the evaluation or the speech processor which includes the control panel 20 and the impedance bridge 23 together with the impedance connection 25 and recorder 24, as indicated above. These devices enable the practitioner to make the adjustment during testing of a subject to assure that the final design aid will be optimum in regard to his particular handicap.

The equalizer 21 of FIG. 1 has not been shown in great detail as it basically serves to combine the low and high frequency bands after processing. However, an equalizer has been shown with a series of connections to the control panel.

The equalizer 21 is a relatively standard unit and can provide frequency selective gain control to compensate for various other deficiencies which might exist in the hearing of a patient which are not of particular concern to the problems solved by the above noted apparatus. The field of equalizing is quite well known and reference can be made to a text entitled RADIOTRON DESIGNERS HANDBOOK by F. L. Smith 4th Edition, (1953) on page 727, Section 5. Examples of various equalizing amplifiers and circuitry can be had by referring to this text.

As indicated, a person with sensorineural hearing loss accompanied by recruitment has difficulty in understanding amplified speech, especially when speech is in the presence of competition. Two groups of subjects with sensorineural hearing loss with recruitment were tested at $+6$ and at 0 db signal-to-noise (S/N) ratio at preferred levels for unprocessed speech and for speech processed through a two-band compression/equalization circuit. In addition, unprocessed key word identification scores were compared to those from use of a hearing aid and of a one-band compression/equalization circuit. Processing by a two-band compression/equalization circuit, as described above, improved key word identification scores dramatically for both groups of subjects. The range of improvement for both groups was from 6 to 74%, mean 37.4%, for the S/N ratio of $+6$ db, and 8 to 86%, mean 39.4% for the S/N ratio of 0 db. Subjects who achieved higher scores had high scores for unprocessed tests and had less recruitment present throughout the frequency range. Scores from one-band compression/equalization were compared to those from unprocessed scores; there were no significant differences in key word identification.

The system can also be used for evaluating and designing hearing aids. Traditional hearing aid evaluation procedures are problematic and subjective. Monosyllabic word tests are not sensitive enough to demonstrate qualitatine differences among hearing aids. Speech tests in general, predict the user's present auditory capabilities and do not attempt to find the true auditory potential of the impaired ear. For example, a PB max score taken through a flat frequency response of a speech audiometer does not give the true maximum discrimination ability of the impaired ear. Even when an aided discrimination score is obtained, there is no reliable way of knowing what the effects of tilting the frequency response would be, or what compression ratio would give a maximum discrimination score. An objective, more scientific method is needed to meet the clinical demands of reliability, validity and efficiency in hearing aid evaluation.

I claim:

1. An audio speech processor apparatus for aiding persons with sensorineural hearing loss, comprising:
    (a) means responsive to a band of audio frequencies for splitting said band into a first low band of frequencies and a second high band of frequencies,
    (b) a first compressor responsive to said low band of frequencies for compressing the same by a given predetermined factor, (c) a second compressor responsive to said high band of frequencies for compressing the same by a different factor, and (d) means for combining said compressed first and second frequency bands to provide a composite signal manifesting a distribution of said band of audio frequencies compensated according to said hearing loss.

2. The apparatus according to claim 1 wherein said means responsive to said band of audio frequencies includes a low pass filter for splitting said band into said first low band of frequencies and a high pass filter for splitting said band into said second high band of frequencies.

3. The apparatus according to claim 2 wherein said low pass filter has a response from 500 to 1,500Hz with a roll off of 48db per octave.

4. The apparatus according to claim 2 wherein said high pass filter has a response from 1,500Hz to 4,000Hz with a roll off of 48db per octave.

5. An audio speech processor apparatus for aiding persons with sensorineural hearing loss, comprising:
   (a) filter means responsive to a band of audio frequencies for filtering said band into a first low band of frequencies and a second high band of frequencies,
   (b) a first compressor responsive to said low band of frequencies for compressing the same by a given predetermined factor, said compressor having a given attack time and a different higher value release time,
   (c) a second compressor response to said high band of frequencies for compressing the same by a different factor than that of said low band, said second compressor having a given attack time different than said attack time of said first compressor and a different release time than that of said first compressor, and
   (d) means for combining said compressed first and second frequency bands to provide a composite signal manifesting a distribution of said band of audio frequencies compensated according to said hearing loss.

6. The apparatus according to claim 5 wherein said filter means includes a band pass filter operative to limit the range of said band of audio frequencies between 500 to 4,000Hz.

7. The apparatus according to claim 5 wherein said attack time of said first compressor is relatively about 5 milliseconds with a release time of about 12 milliseconds.

8. The apparatus according to claim 5 wherein said attack time of said second compressor is relatively about one millisecond with a release time of about 3 milliseconds.

9. The apparatus according to claim 6 wherein said band pass filter is adapted to receive a taped band of audio frequencies.

10. The apparatus according to claim 5 wherein said first and second compressors includes a separate threshold control for adjusting the level at which compression takes place.

11. The apparatus according to claim 5 wherein said speech processor includes an output transducer coupled to said means for combining said compressed frequency bands, said transducer adapted to be worn by a user with a sensorineural hearing loss.

12. The apparatus according to claim 6 further including a low pass filter having an input coupled to said band pass filter for providing said first low band of frequencies at an output.

13. The apparatus according to claim 6 further including a high pass filter having an input coupled to said band pass filter for providing said second high band of frequencies at an output.

14. The apparatus according to claim 12 wherein said low pass filter has a pass band from about 500Hz to 1,500Hz.

15. The apparatus according to claim 13 wherein said high pass filter has a pass band from 1,500Hz to 4,000Hz.

16. The apparatus according to claim 5 wherein said means for combining said first and second frequency bands includes a frequency equalizer.

17. The apparatus according to claim 12 wherein said low pass filter includes a plurality of cascaded operational amplifiers.

18. The apparatus according to claim 13 wherein said high pass filter includes a plurality of cascaded operational amplifiers.

19. The audio speech processor according to claim 5 wherein said first compressor includes an expanding means operative to expand said low band of frequencies below said predetermined factor of said compressor, to reduce low level ambient noise.

20. The apparatus according to claim 10 further including expansion means associated with one of said compressors and operative to expand said associated band of frequencies at levels below said compression level.

21. Apparatus for processing speech to determine the characteristics of an optimum hearing aid device for a handicapped person, comprising:
   (a) means responsive to a band of audio frequencies for splitting said band into a first low band of frequencies and a second high band of frequencies,
   (b) first processor means responsive to said low band of frequencies and operative to compress said low band of frequencies at a given threshold and to expand said band below said threshold for reducing low level ambient noise, to provide at an output a first signal manifesting an optimum low band frequency response for a handicapped person,
   (c) second processor means responsive to said high band of frequencies and operative to compress said high band at a different threshold for providing at an output a second signal manifesting an optimum high band frequency response for said handicapped person, and
   (d) means for combining said first and second signals to provide a composite signal indicative of a distribution of said band of audio frequencies compensated according to the requirements of said handicapped person.

22. A speech processor for aiding persons with sensorineural hearing loss accompanied by recruitment, comprising:
   (a) means for providing a band of audio frequency signals within a predetermined frequency range and derived from a standard audio source, said means operative to provide a first low band of frequencies and a second high band of frequencies,
   (b) first processor means responsive to said low band of frequencies for selectively compressing the same according to the requirements of a handicapped person and including means for expanding said band of frequencies below a level selected for said compression to further aid said person by reducing low level ambient noise, said processor means providing a first output signal containing both compressed and expanded audio signals only within said band manifesting a normalized signal according to the sensorineural hearing loss of said handicapped user, (c) second processor means responsive to said high band of frequencies and operative to compress said high band at a different threshold than said low band and at a substantially lower attack time than that of said first processor to provide a second output signal, and (d) means responsive to said first and second output signals for combining the same to provide a composite signal at an output.

23. The speech processor according to claim 12 wherein said band of audio frequencies is a low frequency band relatively within the range of 500 to 1,500 Hz.

24. The speech processor according to claim 22 wherein said band of audio frequency is derived from a tape recorder audio source.

25. The speech processor according to claim 22 wherein said compression level is variable and adjustable according to the frequency of said audio signals.

26. The speech processor according to claim 22 wherein said means responsive to said output signal includes an X/Y recorder.

27. The speech processor according to claim 22 further including a hearing aid having an input responsive to said output signal from said processor and adapted to be worn by said handicapped person for responding to said signal.

* * * * *